United States Patent
Cheng et al.

(10) Patent No.: US 10,460,948 B2
(45) Date of Patent: Oct. 29, 2019

(54) STRESS ASSISTED WET AND DRY EPITAXIAL LIFT OFF

(71) Applicant: International Business Machines Corporation, Armonk, NY (US)

(72) Inventors: Cheng-Wei Cheng, White Plains, NY (US); Ning Li, White Plains, NY (US); Devendra K. Sadana, Pleasantville, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 14/845,346

(22) Filed: Sep. 4, 2015

(65) Prior Publication Data
US 2017/0069491 A1   Mar. 9, 2017

(51) Int. Cl.
| | |
|---|---|
| H01L 21/3065 | (2006.01) |
| H01L 21/3205 | (2006.01) |
| H01L 21/306 | (2006.01) |
| H01L 21/205 | (2006.01) |
| H01L 21/285 | (2006.01) |
| H01L 21/02 | (2006.01) |

(52) U.S. Cl.
CPC ...... *H01L 21/3065* (2013.01); *H01L 21/0245* (2013.01); *H01L 21/02293* (2013.01); *H01L 21/02455* (2013.01); *H01L 21/02538* (2013.01); *H01L 21/2056* (2013.01); *H01L 21/28556* (2013.01); *H01L 21/30604* (2013.01); *H01L 21/32051* (2013.01)

(58) Field of Classification Search
None
See application file for complete search history.

(56) References Cited

U.S. PATENT DOCUMENTS

| | | | |
|---|---|---|---|
| 4,582,559 A | | 4/1986 | Tanielian et al. |
| 5,641,381 A | * | 6/1997 | Bailey ............... C30B 25/18 |
| | | | 117/915 |
| 8,003,492 B2 | | 8/2011 | Gmitter et al. |
| 8,330,036 B1 | | 12/2012 | Park |
| 2003/0020084 A1 | * | 1/2003 | Fan ............... G02B 27/0093 |
| | | | 257/92 |
| 2007/0249140 A1 | | 10/2007 | Dross et al. |

(Continued)

FOREIGN PATENT DOCUMENTS

| | | | |
|---|---|---|---|
| KR | 20140136557 A | * 12/2014 | |
| WO | 2013184638 A2 | 12/2013 | |
| WO | WO2013/184638 | * 12/2013 | ............ H01L 31/18 |

OTHER PUBLICATIONS

Shahrjerdi et al.; "High-efficiency thin-film InGaP/InGaAs/Ge tandem solar cells enabled by controlled spalling technology"; Applied Physics Letters 100; 2012; pp. 053901-1 to 053901-3.

(Continued)

*Primary Examiner* — Zandra V Smith
*Assistant Examiner* — Molly K Reida
(74) *Attorney, Agent, or Firm* — Harrington & Smith

(57) ABSTRACT

A method comprises providing a sacrificial release layer on a base substrate; forming a device layer on the sacrificial release layer; depositing a metal stressor layer on the device layer; etching the sacrificial release layer; and using epitaxial lift off to release the device layer and the metal stressor layer from the base substrate.

18 Claims, 6 Drawing Sheets

(56) References Cited

U.S. PATENT DOCUMENTS

| | | |
|---|---|---|
| 2010/0047959 A1 | 2/2010 | Cornfeld et al. |
| 2010/0311250 A1 | 12/2010 | Bedell et al. |
| 2013/0005119 A1* | 1/2013 | Bedell ............... H01L 21/187 |
| | | 438/478 |
| 2013/0133730 A1 | 5/2013 | Pan et al. |
| 2013/0240030 A1 | 9/2013 | Masolin et al. |
| 2014/0315389 A1* | 10/2014 | Bedell ............... H01L 21/7813 |
| | | 438/703 |
| 2015/0021624 A1* | 1/2015 | Meyer ............... H01L 21/76256 |
| | | 257/77 |
| 2016/0197227 A1* | 7/2016 | Forrest ............... H01L 21/187 |
| | | 438/691 |

OTHER PUBLICATIONS

Shahrjerdi et al.; "Flexible InGaP/(In)GaAs Tandem Solar Sells with Very High Specific Power"; IEEE 39th Photovoltaic Specialists Conference (PVSC); 2013; pp. 2805-2808.

Bedell et al.; "Kerf-Less Removal of Si, Ge, and III-V Layers by Controlled Spalling to Enable Low-Cost PV Technologies"; IEEE Journal of Photovoltaics, vol. 2, No. 2; 2012; pp. 141-147.

Friedland et al.; "High Mobility Electron Heterostructure Wafer Fused into LiNbO3"; Journal of Electronic Materials, 50; 2001; pp. 817-820.

Schermer et al.; "High rate epitaxial lift-off of InGaP films from GaAs substrates"; Applied Physics Letters, vol. 76, No. 15; 2000; pp. 2131-2133.

Oktyabrsky et al.; "Oxidation lift-off technology"; Optoelectronic Integration on Silicon II; Proceedings of the SPIE International Society for Optics and Photonics; 2005; pp. 149-157.

Lee et al.; "Transfer Printing Methods for Flexible Thin Film Solar Cells: Basic Concepts and Working Principles"; ACS nano, 8(9); 2014; pp. 8746-8756.

\* cited by examiner

STRESS ASSISTED WET AND DRY EPITAXIAL LIFT OFF

BACKGROUND

The exemplary embodiments of this invention relate generally to semiconductor devices and methods for the fabrication thereof and, more specifically, to methods of using thin film stress layers in conjunction with epitaxial lift off techniques to accelerate etching processes in the formation of semiconductor devices.

Optoelectronic devices such as solar cells generally incorporate multiple semiconductor device layers. Such device layers are typically flexible to some degree and are fabricated by being grown or otherwise formed on and subsequently separated from parent substrates of semiconductor material (e.g., III-V materials such as gallium arsenide (GaAs)). The semiconductor device layers may be separated from the parent substrates using epitaxial lift off (ELO) techniques. The ELO techniques generally involve the use of a sacrificial release layer under the semiconductor device layer, with the sacrificial layer being etched with hydrofluoric acid (HF) to release the semiconductor device layer from the parent substrate. However, such processes using HF etching of sacrificial layers are oftentimes very slow.

Other ELO techniques utilize wax stressor layers on the semiconductor device layers to assist with the epitaxial lift off of the semiconductor device layers from the parent substrate. Still other techniques involve mounting foils with wax on the semiconductor device layers and carrying out the epitaxial lift off by loading the mounting foils using weight in conjunction with etching the sacrificial release layer using HF.

BRIEF SUMMARY

In one aspect, a method comprises providing a sacrificial release layer on a base substrate; forming a device layer on the sacrificial release layer; depositing a metal stressor layer on the device layer; etching the sacrificial release layer; and using epitaxial lift off to release the device layer and the metal stressor layer from the base substrate.

In another aspect, a method comprises providing a base substrate; epitaxially forming a sacrificial release layer on the base substrate; epitaxially forming a layer of III-V material on the sacrificial release layer; depositing a metal stressor layer on the layer of III-V material to cause the layer of III-V material on the sacrificial release layer and the metal stressor layer to curve away from the base substrate; etching the sacrificial release layer; and using epitaxial lift off to release the layer of III-V material and the metal stressor layer from the base substrate.

In another aspect, a method comprises providing a base substrate of a first III-V material; epitaxially forming a sacrificial release layer of a second III-V material on the base substrate; epitaxially forming a device layer of a third III-V material on the sacrificial release layer; depositing a metal stressor layer on the layer of third III-V material to cause the layer of third III-V material on the sacrificial release layer and the metal stressor layer to curve away from the base substrate; etching the sacrificial release layer with an etchant; using epitaxial lift off to release the layer of third III-V material and the metal stressor layer from the base substrate; and removing the stressor layer from the layer of third III-V material.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

As used herein, the term "III-V" refers to inorganic crystalline compound semiconductors having at least one Group III element and at least one Group V element. Exemplary III-V compounds for use in the structures and methods described herein include, but are not limited to, gallium arsenide (GaAs), aluminum arsenide (AlAs), gallium phosphide (Gap), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP), and combinations of the foregoing.

In the exemplary methods as described herein, optoelectronic devices such as high efficiency flexible III-V based solar cells are formed by epitaxially forming sacrificial release layers on base substrates, forming device layers on the sacrificial release layers, depositing stressor layers on the device layers, and using etching and ELO techniques to remove the stressor layers and the device layers from the base substrates. The materials of the base substrates, sacrificial release layers, and the device layers comprise the III-V semiconductor materials. The III-V semiconductor materials of the device layers may define upright or inverted single junction structures, multi-junction structures, or the like.

The epitaxial growth of the III-V semiconductor materials as the device layers allows the III-V semiconductor materials of the device layers to be lattice-matched to the III-V material of the base substrate. The use of ELO techniques allows for the removal of the device layers as thin films to form devices having increased mechanical robustness (as compared to other removal techniques) due to the flexibility of the thin films. In addition to being flexible, the device layers produced by ELO are thinner and lighter than devices produced using other techniques, thereby allowing the layers to be arranged in a multitude of configurations to provide power to an electronic device. The integration and arrangement (e.g., the stacking and layout) of the device layers can be tailored to meet the requirements desired for a specified product.

Figure 1A:
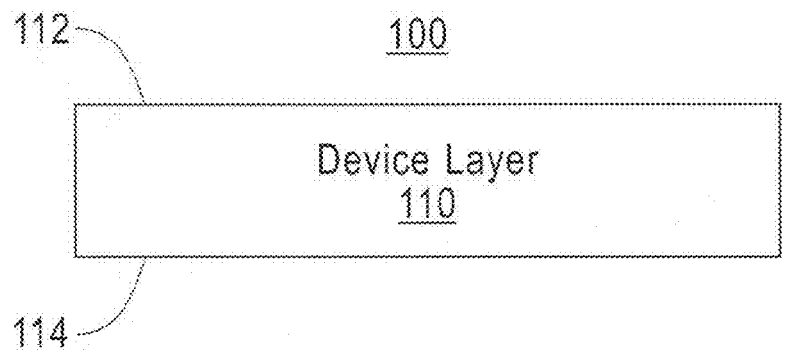
FIG. 1A is a schematic representation of a device layer.
Figure 1B:
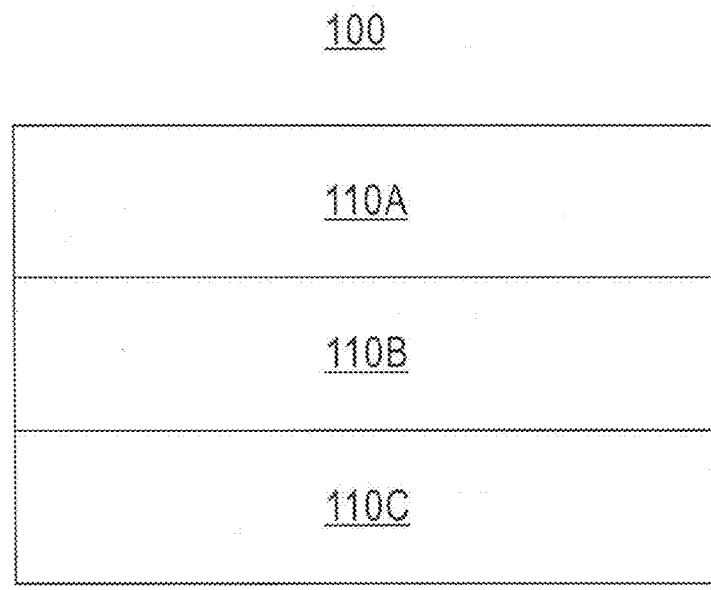
FIG. 1B is a schematic representation of a plurality of layers forming a device layer.

As shown in FIG. 1A, one exemplary embodiment of a structure comprising a device layer is designated generally by the reference number 100 and is hereinafter referred to as "structure 100." Structure 100 comprises an epitaxially grown III-V material as the device layer (shown at 110) having an anode side 112 and a cathode side 114. The device layer(s) 110 may be formed by applying a hardmask to pattern the III-V material and etching. As shown in FIG. 1B, the structure 100 may, in the alternative, comprise a plurality of device layers 110A, 110B, 110C of epitaxially grown III-V materials, each having an anode side and a cathode side, with each device layer 110A, 110B, 110C being arranged such that anode sides are disposed on or against respective cathode sides on adjacent device layers 110A, 110B, 110C.

Figure 2:
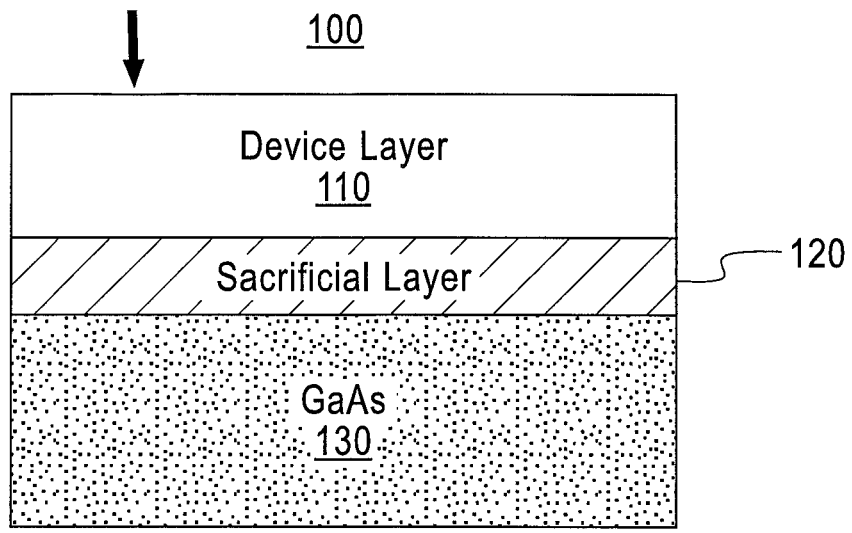
FIG. 2 is a schematic representation of a sacrificial layer on a substrate and a device layer on the sacrificial layer.

As shown in FIGS. 2-6, one exemplary method of fabricating the structure 100 is shown. As shown in FIG. 2, a sacrificial release layer 120 may be epitaxially formed on a base substrate 130 comprising GaAs. However, the structure 100 is not so limited, as the base substrate 130 may comprise one or more of silicon (Si), silicon carbide (SiC), germanium (Ge), GaN, indium phosphide (InP), other III-V material, combinations of the foregoing materials, or the like. In some embodiments, the sacrificial release layer 120 comprises AlAs or germanium, although other materials including, but not limited to, AlAsSb, AlPSb, combinations of the foregoing materials, and the like, may be also be used.

The device layer 110 is epitaxially formed on the sacrificial release layer 120.

Figure 3:
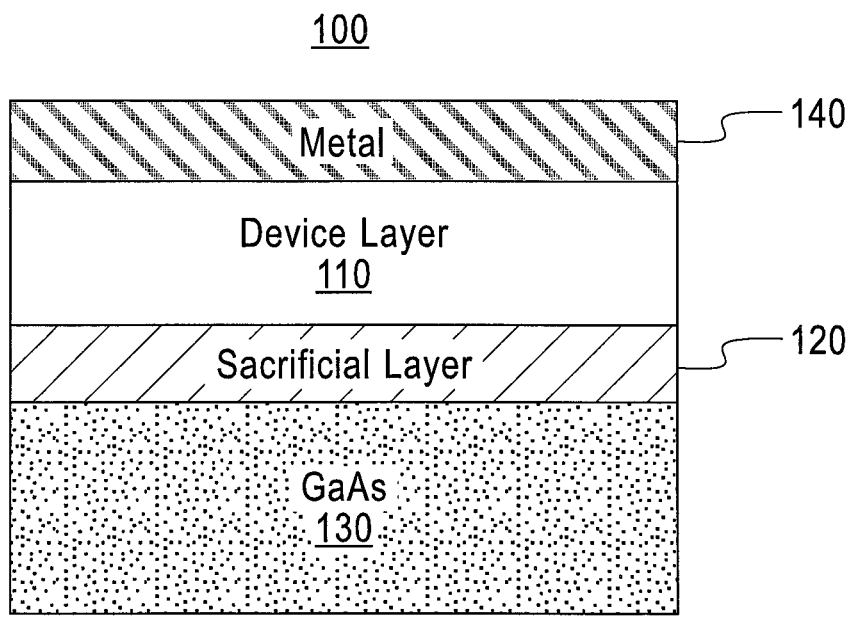
FIG. 3 is a schematic representation of a stressor layer on the device layer of FIG. 2.

As shown in FIG. 3, a stressor layer 140 may be deposited directly on the device layer 110. The stressor layer 140 comprises a metal or an alloy (e.g., nickel, nickel alloy, or the like) and is deposited on the device layer 110 instead of wax. Exemplary methods of depositing the metal or alloy include, but are not limited to, physical vapor deposition, chemical vapor deposition, atomic layer chemical vapor deposition, and the like.

Figure 4A:
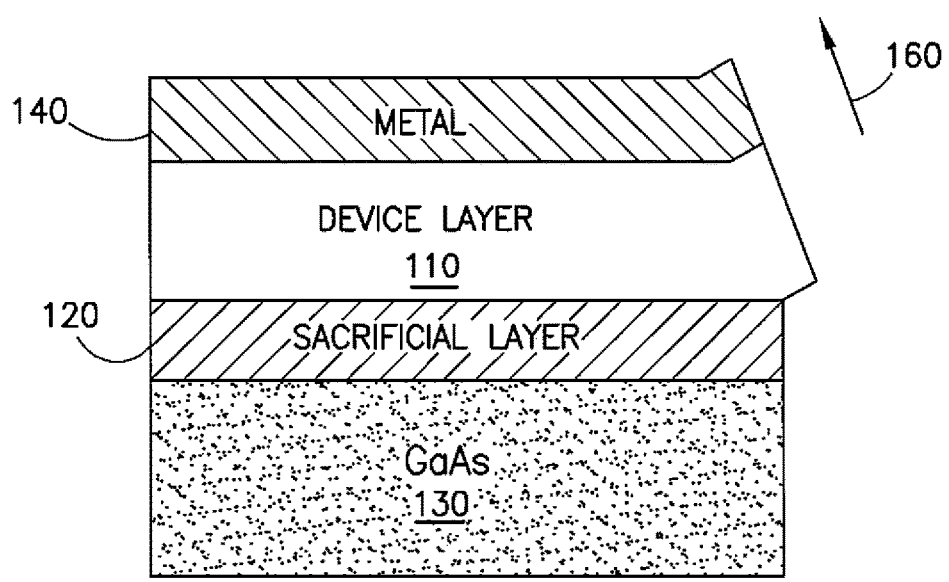
FIGS. 4A and 4B are schematic representations of a process of etching the sacrificial layer and removing the device layer and the stressor layer from the substrate.
Figure 4B:
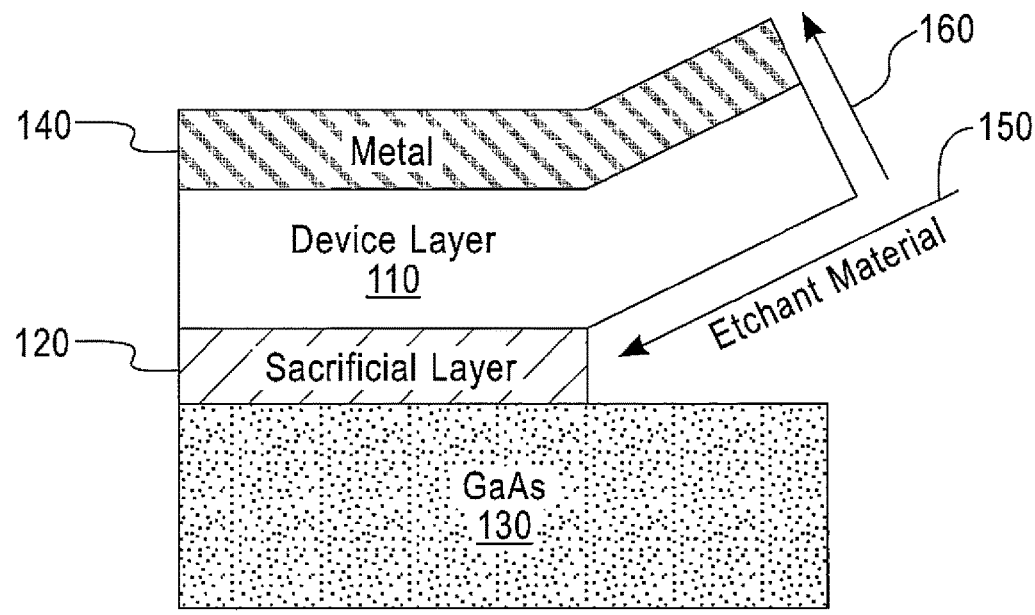

As shown in FIG. 4A, the stressor layer 140 creates a curvature in the device layer 110 to cause the device layer 110 to bend away from the base substrate 130 and expose at least a portion of the sacrificial release layer 120. The stressor layer 140 creates the curvature in the direction of an arrow 160. As shown in FIG. 4B, the sacrificial release layer 120 may then be etched (shown by arrow 150) by either a liquid or a gas etchant depending upon the material of the sacrificial release layer 120. If a wet etching process is to be used in the separation of the device layer 110 from the base substrate 130, the sacrificial release layer 120 may be AlAs. If a dry etching process is to be used in the separation of the device layer 110 from the base substrate 130, the sacrificial release layer 120 may be germanium. For example, if the sacrificial release layer 120 is AlAs and a wet etching process is desired, the sacrificial release layer 120 may be exposed to HF as an etchant. If the sacrificial release layer 120 is germanium and a dry etching process is desired, the sacrificial release layer 120 may be exposed to $XeF_2$ as an etching gas. The etching facilitates the epitaxial lift off of the device layer 110 from the base substrate 130.

Figure 5:
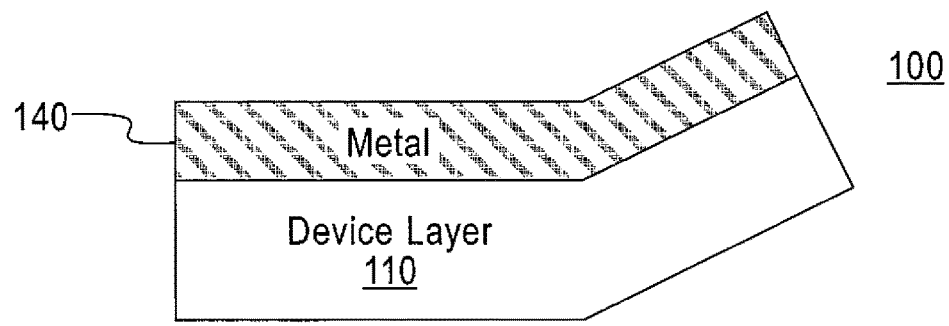
FIG. 5 is a schematic representation of the removed device layer and stressor layer.

Referring to FIG. 5, upon separation of the device layer 110 from the base substrate 130, an appropriate method to handle the released device layer 110/stressor layer 140 configuration is carried out.

Figure 6:
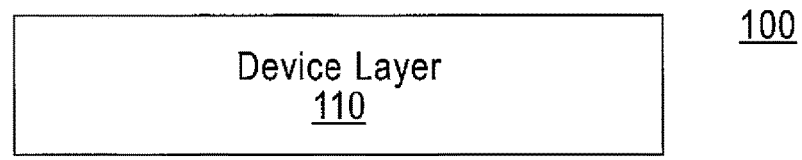
FIG. 6 is a schematic representation of the device layer with the stressor layer removed therefrom.

Referring to FIG. 6, the stressor layer 140 is removed from the device layer 110 by wet-etching with an acid, an oxidizing agent, a base, or a combination of any of the foregoing materials.

Figure 7:
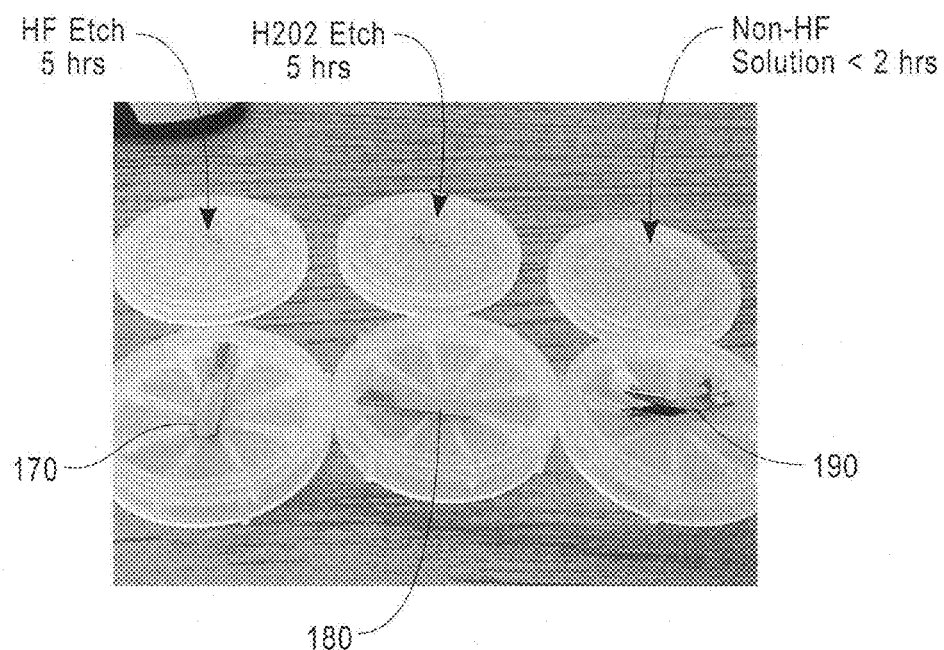
FIG. 7 is a photograph of various device layers in partial stages of separation from substrates using various etchants.

Referring now to FIG. 7, etching of the sacrificial release layer 120 may be carried out using materials other than HF and $XeF_2$. Use of non-HF materials to etch the AlAs may provide faster etching than the use of HF. As shown, an HF etch 170 (e.g., of AlAs) may take about 5 hours to separate the device layer 110 from the base substrate 130. Furthermore, a hydrogen peroxide etch 180 may also take about 5 hours to separate the device layer 110 from the base substrate 130. On the other hand, etching 190 using a non-HF solution may take less than about 2 hours to separate the device layer 110 from the base substrate 130. Non-HF solutions that may be used to separate the device layer 110 from the base substrate 130 include, but are not limited to, HCl-based chemicals such as hydrochloric acid, hypochlorous acid, combinations of the foregoing materials, and the like.

Figure 8:
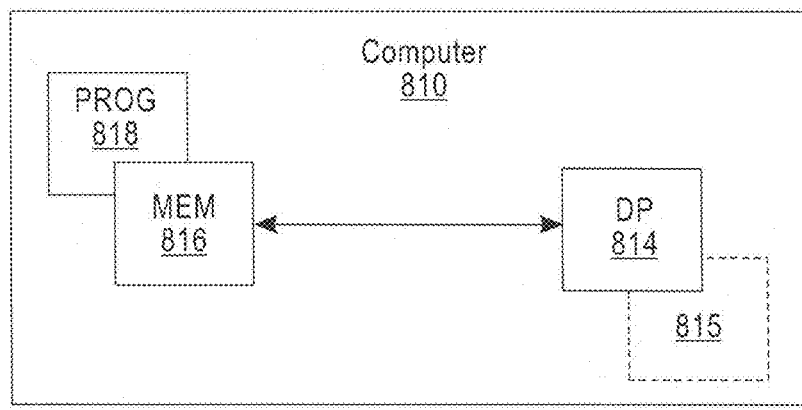
FIG. 8 is a block diagram of various electronic devices and apparatuses that may be suitable for use in the methods of using thin film stress layers and ELO to carry out etching processes in the formation of semiconductor devices.

As shown in FIG. 8, a simplified block diagram of various electronic devices and apparatuses that are suitable for use in practicing the exemplary embodiments described herein is shown. For example, a computer 810 may be used to control one or more of the deposition, ELO, and etching processes as described above. The computer 810 includes a controller, such as a computer or a data processor (DP) 814 and a computer-readable memory medium embodied as a memory (MEM) 816 that stores a program of computer instructions (PROG) 818.

The PROG 818 includes program instructions that, when executed by the associated DP 814, enable the various electronic devices and apparatus to operate in accordance with exemplary embodiments. That is, various exemplary embodiments may be implemented at least in part by computer software executable by the DP 814 of the computer 810, or by hardware, or by a combination of software and hardware (and firmware).

The computer 810 may also include dedicated processors, for example flexible semiconductor modeling processor 815.

The computer readable MEM 816 may be of any type suitable to the local technical environment and may be implemented using any suitable data storage technology, such as semiconductor based memory devices, flash memory, magnetic memory devices and systems, optical memory devices and systems, fixed memory, and removable memory. The DP 814 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Figure 9:
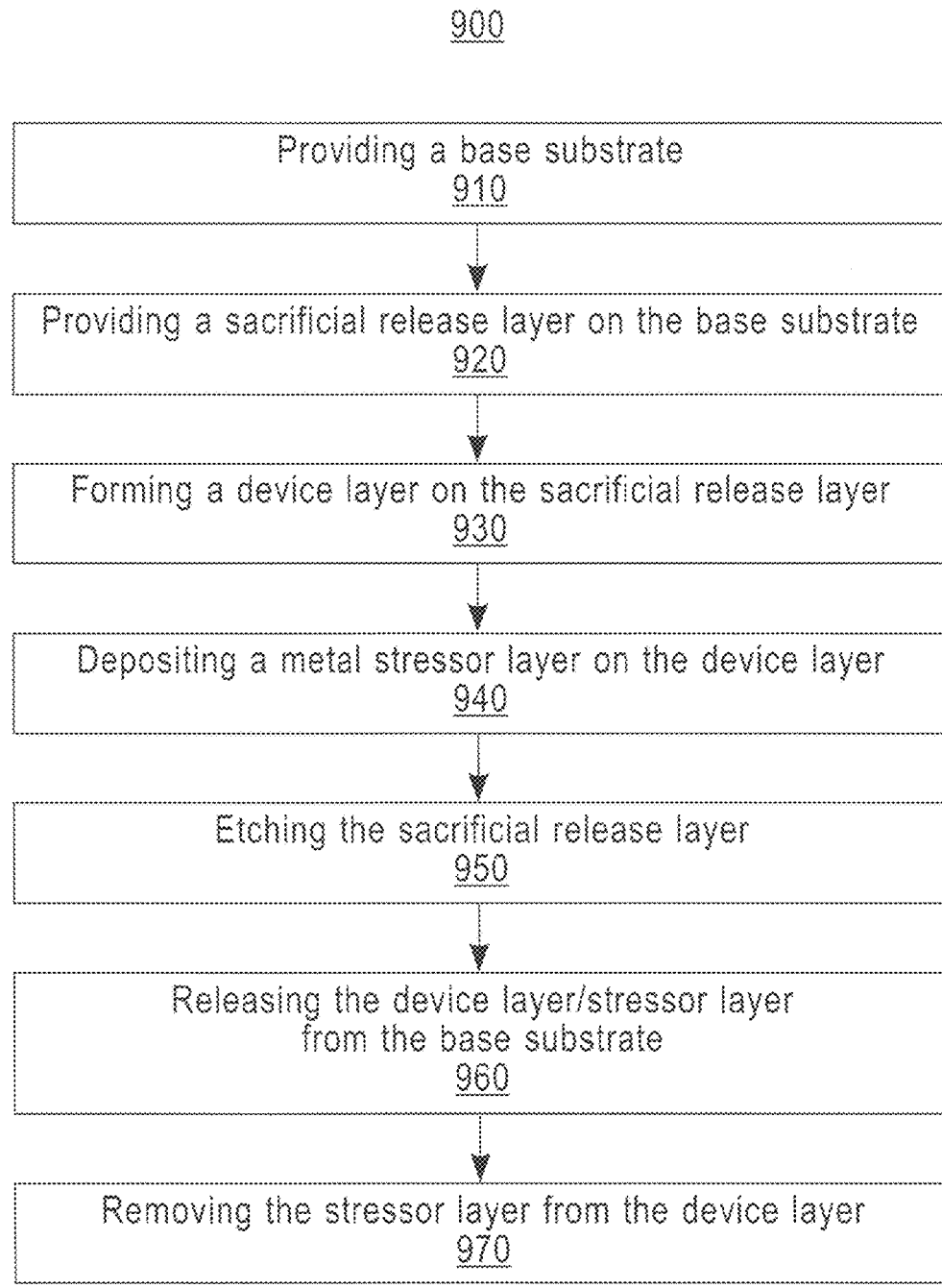
FIG. 9 is a logic flow diagram that illustrates the operation of an exemplary method, and a result of execution of computer program instructions embodied on a computer readable memory, in accordance with an exemplary embodiment of the methods of using thin film stress layers and ELO to carry out etching processes in the formation of semiconductor devices.

FIG. 9 is a logic flow diagram that illustrates the operation of a method 900 (and a result of an execution of computer program instructions (such as PROG 818)), in accordance with the exemplary embodiments. In accordance with these exemplary embodiments, a base substrate is provided in block 910, the base substrate comprising a III-V material such as GaAs or the like. A sacrificial release layer (e.g., AlAs or germanium) is provided on the base substrate in block 920, and a device layer is formed on the sacrificial release layer in block 930. As shown in block 940, a metal stressor layer (e.g., nickel) is deposited on the device layer to cause the device layer to bend away from the base substrate and expose at least a portion of the sacrificial release layer. As shown in block 950, an etch step is carried out, with the sacrificial release layer being etched by either a liquid or gas etchant depending upon the material of the sacrificial release layer. As shown in block 960, the device layer with the attached stressor layer is released from the base substrate without force upon the sacrificial release layer being etched away. As shown in block 970, the stressor layer is removed from the device layer.

The various blocks of method 900 shown in FIG. 9 may be viewed as method steps, and/or as operations that result from operation of computer program code, and/or as a plurality of coupled logic circuit elements constructed to carry out the associated function(s).

Taking into account all the Figures, in one exemplary embodiment, a method comprises providing a sacrificial release layer on a base substrate; forming a device layer on the sacrificial release layer; depositing a metal stressor layer on the device layer; etching the sacrificial release layer; and using epitaxial lift off to release the device layer and the metal stressor layer from the base substrate.

The method may further comprise removing the metal stressor layer from the device layer. Providing a sacrificial release layer on a base substrate may comprise epitaxially forming the sacrificial release layer on the base substrate. Forming a device layer on the sacrificial release layer may comprise providing a layer of III-V material, applying a hardmask to pattern the layer of III-V material, and etching the patterned hardmask. Depositing a metal stressor layer on the device layer may comprise depositing a metal by one or more of physical vapor deposition, chemical vapor deposition, and atomic layer chemical vapor deposition. Etching the sacrificial release layer may comprise applying one or more of a liquid etchant and a gas etchant.

In another exemplary embodiment, a method comprises providing a base substrate; epitaxially forming a sacrificial release layer on the base substrate; epitaxially forming a layer of III-V material on the sacrificial release layer; depositing a metal stressor layer on the layer of III-V material to cause the layer of III-V material on the sacrificial release layer and the metal stressor layer to curve away from the base substrate; etching the sacrificial release layer; and using epitaxial lift off to release the layer of III-V material and the metal stressor layer from the base substrate.

The method may further comprise removing the stressor layer from the layer of III-V material. Epitaxially forming a layer of III-V material on the sacrificial release layer may further comprise patterning the layer of III-V material and etching the patterned layer. Depositing a metal stressor layer on the layer of III-V material may comprise depositing a metal by one or more of physical vapor deposition, chemical vapor deposition, and atomic layer chemical vapor deposition. Etching the sacrificial release layer may comprise applying one or more of a liquid etchant and a gas etchant to the sacrificial release layer.

In another exemplary embodiment, a method comprises providing a base substrate of a first III-V material; epitaxially forming a sacrificial release layer of a second III-V material on the base substrate; epitaxially forming a device layer of a third III-V material on the sacrificial release layer; depositing a metal stressor layer on the layer of third III-V material to cause the layer of third III-V material on the sacrificial release layer and the metal stressor layer to curve away from the base substrate; etching the sacrificial release layer with an etchant; using epitaxial lift off to release the layer of third III-V material and the metal stressor layer from the base substrate; and removing the stressor layer from the layer of third III-V material.

Epitaxially forming a layer of third III-V material on the sacrificial release layer may comprise patterning the layer of third III-V material and etching the patterned layer. Depositing a metal stressor layer on the layer of third III-V material may comprise depositing one or more of a metal and an alloy by one or more of physical vapor deposition, chemical vapor deposition, and atomic layer chemical vapor deposition. The first III-V material of the base substrate may comprise GaAs. The first III-V material of the base substrate may comprise one or more of silicon (Si), silicon carbide (SiC), germanium, GaN, indium phosphide (InP), other III-V material, and combinations of the foregoing materials. The second III-V material of the sacrificial release layer comprises AlAs or germanium. If the second III-V material comprises AlAs, the etchant may comprise HF, and if the second III-V material comprises germanium, the etchant may comprise $XeF_2$. The etchant may be a non-HF solution. The metal stressor layer may comprise nickel or nickel alloy.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A method, comprising:
   providing a sacrificial release layer on a base substrate;
   forming a device layer on the sacrificial release layer;
   depositing a metal stressor layer on the device layer;
   creating a curvature in the device layer and causing the device layer to bend away from the base substrate at a first edge of the device layer such that the device layer remains in contact with the sacrificial release layer at least at a second opposing edge of the device layer;
   etching the sacrificial release layer from an end surface thereof as the device layer is caused to bend away from the first edge and as the sacrificial release layer is exposed; and releasing the device layer and the metal stressor layer from the base substrate.

2. The method of claim 1, further comprising removing the metal stressor layer from the device layer.

3. The method of claim 1, wherein providing a sacrificial release layer on a base substrate comprises epitaxially forming the sacrificial release layer on the base substrate.

4. The method of claim 1, wherein forming a device layer on the sacrificial release layer comprises providing a layer of III-V material.

5. The method of claim 1, wherein depositing a metal stressor layer on the device layer comprises depositing a metal by one or more of physical vapor deposition, chemical vapor deposition, and atomic layer chemical vapor deposition.

6. The method of claim 1, wherein etching the sacrificial release layer comprises applying one or more of a liquid etchant and a gas etchant.

7. A method, comprising:
providing a base substrate;
epitaxially forming a sacrificial release layer on the base substrate;
epitaxially forming a layer of III-V material on the sacrificial release layer;
depositing a metal stressor layer on the layer of III-V material;
causing the layer of III-V material on the sacrificial release layer and the metal stressor layer to curve away from the base substrate at a first edge of the layer of III-V material such that the layer of III-V material remains in contact with the sacrificial release layer at least at a second opposing edge of the layer of III-V material;
etching the sacrificial release layer from an end surface thereof as the layer of III-V material is caused to curve away from the first edge and as the sacrificial release layer is exposed; and
releasing the layer of III-V material and the metal stressor layer from the base substrate.

8. The method of claim 7, further comprising removing the stressor layer from the layer of III-V material.

9. The method of claim 7, wherein depositing a metal stressor layer on the layer of III-V material comprises depositing a metal by one or more of physical vapor deposition, chemical vapor deposition, and atomic layer chemical vapor deposition.

10. The method of claim 7, wherein etching the sacrificial release layer comprises applying one or more of a liquid etchant and a gas etchant to the sacrificial release layer.

11. A method, comprising:
providing a base substrate of a first III-V material;
epitaxially forming a sacrificial release layer of a second III-V material on the base substrate;
epitaxially forming a device layer of a third III-V material on the sacrificial release layer;
depositing a metal stressor layer on the device layer of third III-V material;
causing the device layer of third III-V material on the sacrificial release layer and the metal stressor layer to curve away from the base substrate at a first edge of the device layer of third III-V material and the metal stressor layer such that the device layer of third III-V material remains in contact with the sacrificial release layer at least at a second opposing edge of the device layer of third III-V material;
etching the sacrificial release layer with an etchant from an end surface of the sacrificial release layer as the device layer of third III-V material is caused to curve away from the first edge and as the sacrificial release layer is exposed;
releasing the device layer of third III-V material and the metal stressor layer from the base substrate; and
removing the stressor layer from the device layer of third III-V material.

12. The method of claim 11, wherein depositing a metal stressor layer on the layer of third III-V material comprises depositing one or more of a metal and an alloy by one or more of physical vapor deposition, chemical vapor deposition, and atomic layer chemical vapor deposition.

13. The method of claim 11, wherein the first III-V material of the base substrate comprises GaAs.

14. The method of claim 11, wherein the first III-V material of the base substrate comprises one or more of silicon (Si), silicon carbide (SiC), germanium, GaN, indium phosphide (InP), other III-V material, and combinations of the foregoing materials.

15. The method of claim 11, wherein the second III-V material of the sacrificial release layer comprises AlAs or germanium.

16. The method of claim 15, wherein if the second III-V material comprises AlAs, the etchant comprises HF, and if the second III-V material comprises germanium, the etchant comprises $XeF_2$.

17. The method of claim 11, wherein the etchant is a non-HF solution.

18. The method of claim 11, wherein the metal stressor layer comprises nickel or nickel alloy.

* * * * *